United States Patent
Li et al.

(10) Patent No.: US 11,950,445 B2
(45) Date of Patent: Apr. 2, 2024

(54) FOLDABLE DISPLAY SCREEN INCLUDING MULTI-COVER PROTECTION LAYERS

(71) Applicant: BOE TECHNOLOGY GROUP CO., LTD, Beijing (CN)

(72) Inventors: Zhao Li, Beijing (CN); Shiming Shi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 844 days.

(21) Appl. No.: 16/957,768

(22) PCT Filed: Aug. 19, 2019

(86) PCT No.: PCT/CN2019/101415
§ 371 (c)(1),
(2) Date: Jun. 25, 2020

(87) PCT Pub. No.: WO2021/031079
PCT Pub. Date: Feb. 25, 2021

(65) Prior Publication Data
US 2023/0101087 A1 Mar. 30, 2023

(51) Int. Cl.
*H10K 50/84* (2023.01)
*H10K 50/844* (2023.01)
(Continued)

(52) U.S. Cl.
CPC ........... *H10K 50/844* (2023.02); *H10K 59/40* (2023.02); *G09F 9/301* (2013.01);
(Continued)

(58) Field of Classification Search
CPC .............. H10K 50/844; H10K 59/40; H10K 2102/311; H10K 50/8445; H10K 50/8426;
(Continued)

(56) References Cited

U.S. PATENT DOCUMENTS 10,227,513 B2    3/2019   Moon et al.
10,367,173 B1 *  7/2019   Wu ..................... H04M 1/0268
(Continued)

FOREIGN PATENT DOCUMENTS

CN    103682154 A    3/2014
CN    105567137 A    5/2016
(Continued)

OTHER PUBLICATIONS

Office action issued for Chinese Application No. 201980001387.3, dated Mar. 25, 2022, 16 pages.

*Primary Examiner* — Ida M Soward
(74) *Attorney, Agent, or Firm* — Raj S. Dave; Dave Law Group LLC (57) ABSTRACT

A foldable display screen includes a display panel, a first optical adhesive layer, a first cover protection layer, a second optical adhesive layer, and a second cover protection layer; the first optical adhesive layer is located on the display panel; the first cover protection layer is located on a side of the first optical adhesive layer away from the display panel; the second optical adhesive layer is located on a side of the first cover protection layer away from the first optical adhesive layer; the second cover protection layer is located on a side of the second optical adhesive layer away from the first cover protection layer. At an operating temperature, an elastic modulus of the second optical adhesive layer is smaller than an elastic modulus of the first optical adhesive layer.

16 Claims, 3 Drawing Sheets

(51) Int. Cl.
*H10K 59/40* (2023.01)
*G09F 9/30* (2006.01)
*H10K 50/842* (2023.01)
*H10K 102/00* (2023.01)

(52) U.S. Cl.
CPC ..... *G09G 2380/02* (2013.01); *H10K 50/8426* (2023.02); *H10K 50/8445* (2023.02); *H10K 2102/311* (2023.02)

(58) Field of Classification Search
CPC ... H10K 77/111; G06F 1/1637; G06F 1/1643; G06F 1/1652; G06F 3/044; G06F 2203/04102; G09F 9/301; G09G 2380/02
See application file for complete search history.

(56) References Cited

U.S. PATENT DOCUMENTS

| | | | |
|---|---|---|---|
| 10,476,037 B2 | 11/2019 | Mun et al. | |
| 2013/0193832 A1* | 8/2013 | Jung | H10K 50/86 156/60 |
| 2013/0265641 A1* | 10/2013 | Kakubari | G02B 30/34 156/60 |
| 2016/0211482 A1* | 7/2016 | Namkung | H10K 77/111 |
| 2017/0153668 A1 | 6/2017 | Jang et al. | |
| 2017/0263890 A1* | 9/2017 | Chun | H10K 50/844 |
| 2017/0373121 A1* | 12/2017 | Leng | G09G 3/20 |
| 2019/0006619 A1 | 1/2019 | Hu et al. | |
| 2019/0107866 A1* | 4/2019 | Han | G06F 1/1637 |
| 2019/0115547 A1 | 4/2019 | Lee et al. | |
| 2019/0193374 A1 | 6/2019 | Yamasaki et al. | |
| 2019/0273212 A1* | 9/2019 | Shin | H10K 50/8426 |
| 2019/0312230 A1* | 10/2019 | Ochi | G09F 9/30 |
| 2020/0119291 A1* | 4/2020 | Jeon | G06F 1/1652 |
| 2021/0257394 A1* | 8/2021 | Yamazaki | G02F 1/1339 |

FOREIGN PATENT DOCUMENTS

| | | | | | |
|---|---|---|---|---|---|
| CN | 106449712 | A | * | 2/2017 | ....... G06F 3/041 |
| CN | 107305756 | A | | 10/2017 | |
| CN | 207114815 | U | * | 3/2018 | |
| CN | 107980155 | A | | 5/2018 | |
| CN | 108351547 | A | | 7/2018 | |
| CN | 208225379 | U | | 12/2018 | |
| CN | 109249659 | A | | 1/2019 | |
| CN | 109564319 | A | | 4/2019 | |
| KR | 20160079485 | A | * | 7/2016 | ....... G02F 1/133308 |
| KR | 20190030912 | A | * | 3/2019 | ............ G09F 9/301 |
| KR | 20190044267 | A | * | 4/2019 | ............ G09F 9/301 |
| WO | WO-2016085182 | A1 | * | 6/2016 | ........... G06F 1/1652 |
| WO | WO-2019003726 | A1 | * | 1/2019 | ............. B32B 15/08 |
| WO | 2019074935 | A1 | | 4/2019 | |

* cited by examiner

FOLDABLE DISPLAY SCREEN INCLUDING MULTI-COVER PROTECTION LAYERS

CROSS-REFERENCE TO RELATED APPLICATIONS

This application is the National Stage Entry of PCT/CN2019/101415 filed on Aug. 19, 2019, the entire disclosure of which is incorporated herein by reference as part of the disclosure of this application.

TECHNICAL FIELD

Embodiments of the present disclosure relate to a foldable display screen, a manufacturing method and a display device.

BACKGROUND

Currently, a smart phone has become one of the most important terminal equipment in people's work and life. With continuous development of the smart phone market, in order to have advantages of portability and large-size screen etc., a foldable screen mobile phone has gradually become a research hotspot for major manufacturers. Usually, the foldable screen mobile phone comprises a foldable display screen; the foldable display screen can be folded in the middle of the screen, so that the foldable display screen has two states of a folded state and an expanded state. When the foldable display screen is in the folded state, an area occupied by the foldable screen mobile phone is small, which facilitates to carry and operate by one hand; when the foldable display screen is in the expanded state, a display area of the foldable screen mobile phone is large, which has better visual experience and more functions.

Generally, the foldable display screens can be usually divided into a foldable display screen bent inward and a foldable display screen bent outward. The foldable display screen bent inward refers to that a folding direction of the foldable display screen is a light emitting direction of the foldable display screen, so that light emitting surfaces on both sides of a bending region face to each other; the foldable display screen bent outward refers to that the folding direction of the foldable display screen is opposite to the light emitting direction of the foldable display screen, so that the light emitting surfaces on the both sides of the bending region face away from each other.

SUMMARY

The embodiments of the present disclosure provide a foldable display screen and a display device. The foldable display screen comprises a display panel, a first optical adhesive layer, a first cover protection layer, a second optical adhesive layer and a second cover protection layer; the first optical adhesive layer is located on the display panel; the first cover protection layer is located on a side of the first optical adhesive layer away from the display panel; the second optical adhesive layer is located on a side of the first cover protection layer away from the first optical adhesive layer; the second cover protection layer is located on a side of the second optical adhesive layer away from the first cover protection layer; at an operating temperature, an elastic modulus of the second optical adhesive layer is smaller than an elastic modulus of the first optical adhesive layer. Thus, on the one hand, the foldable display can improve the mechanical properties of the foldable display, such as the pencil hardness, the impact resistance, and the scratch resistance etc., by providing two cover protection layers; on the other hand, the foldable display screen can prevent important film layers of the foldable display screen from breaking while improving the mechanical properties of the foldable display screen, such as the pencil hardness, the impact resistance and the scratch resistance, etc.

At least one embodiment of the present disclosure provides a foldable display screen, comprising: a display panel; a first optical adhesive layer on the display panel; a first cover protection layer on a side of the first optical adhesive layer away from the display panel; a second optical adhesive layer on a side of the first cover protection layer away from the first optical adhesive layer; and a second cover protection layer on a side of the second optical adhesive layer away from the first cover protection layer, at an operating temperature, an elastic modulus of the second optical adhesive layer is smaller than an elastic modulus of the first optical adhesive layer.

For example, in a foldable display screen according to an embodiment of the present disclosure, the operating temperature ranges from 0 to 60 degrees Celsius.

For example, in a foldable display screen according to an embodiment of the present disclosure, in the range of operating temperature 0 to 60 degrees Celsius, a ratio of the elastic modulus of the second optical adhesive layer and the elastic modulus of the first optical adhesive layer ranges from 1/3 to 4/5.

For example, in a foldable display screen according to an embodiment of the present disclosure, the elastic modulus of the second optical adhesive layer at the temperature of 20 degrees Celsius ranges from 20 to 40 Kpa, and the elastic modulus of the second optical adhesive layer at the temperature of 60 degrees Celsius ranges from 5 to 25 Kpa.

For example, in a foldable display screen according to by an embodiment of the present disclosure, the elastic modulus of the first optical adhesive layer at the temperature of 20 degrees Celsius ranges from 40 to 60 Kpa, and the elastic modulus of the first optical adhesive layer at the temperature of 60 degrees Celsius ranges from 20 to 40 Kpa.

For example, a foldable display screen according to an embodiment of the present disclosure further comprises: a touch layer between the display panel and the first optical adhesive layer, and a neutral layer of the foldable display screen comprises at least one of the display panel and the touch layer.

For example, in a foldable display screen according to an embodiment of the present disclosure, the display panel comprises an organic light emitting diode display panel, the organic light emitting diode display panel comprises a light emitting layer and a packaging layer covering the light emitting layer, the touch layer is located on a side of the packaging layer away from the light emitting layer and is in direct contact with the packaging layer, the neutral layer comprises at least one of the light emitting layer, the packaging layer, and the touch layer.

For example, a foldable display screen according to an embodiment of the present disclosure further comprises: an anti-reflective layer between the touch layer and the first optical adhesive layer, a base film on a side of the display panel away from the touch layer; and a support plate on a side of the base film away from the display panel.

For example, in a foldable display screen according to an embodiment of the present disclosure, the anti-reflective layer comprises a polarizer.

For example, a foldable display screen according to an embodiment of the present disclosure further comprises: a first adhesive layer between the anti-reflective layer and the touch layer; a second adhesive layer between the touch layer and the display panel; and a third optical adhesive layer between the base film and the support plate.

For example, in a foldable display screen according to an embodiment of the present disclosure, edges of the anti-reflective layer, the display panel, and the touch layer are level with one another.

For example, in a foldable display screen according to an embodiment of the present disclosure, the first cover protection layer comprises a flexible polymer layer.

For example, in a foldable display screen according to an embodiment of the present disclosure, the second cover protection layer comprises a flexible polymer layer and a harden layer.

For example, in a foldable display screen according to an embodiment of the present disclosure, orthographic projections of the first cover protection layer, the second cover protection layer, the first optical adhesive layer and the second optical adhesive layer on a plane parallel to a main surface of the display panel completely coincide.

For example, in a foldable display screen according to an embodiment of the present disclosure, a thickness of the first optical adhesive layer ranges from 40 to 60 microns, and a thickness of the second optical adhesive layer ranges from 40 to 60 microns.

For example, a foldable display screen according to an embodiment of the present disclosure comprises: a bending region; and a non-bending region, and the bending region is configured to be bent along a rotation axis extending in a first direction, the non-bending region is located on at least one side of the bending region in a second direction, and the first direction is perpendicular to the second direction.

For example, in a foldable display screen according to an embodiment of the present disclosure, a size of the bending region in the first direction is equal to a size of the non-bending region in the first direction.

At least one embodiment of the present disclosure provides a display device comprising the foldable display screen described above.

At least one embodiment of the present disclosure also provides a method of manufacturing the above-mentioned foldable display screen, comprising: forming the display panel; forming a base film on a side of the display panel; forming a touch layer and an anti-reflective layer on a side of the display panel away from the base film; forming a cover protection layer, the cover protection layer comprising the first cover protection layer, the first optical adhesive layer, the second cover protection layer, and the second optical adhesive layer; and attaching a side of the protection optical layer where the first optical adhesive layer is located to a side of the anti-reflective layer away from the touch layer.

BRIEF DESCRIPTION OF THE DRAWINGS

In order to clearly illustrate the technical solution of the embodiments of the disclosure, the drawings of the embodiments will be briefly described in the following. It is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "comprise," "including," etc., are intended to specify that the elements or the objects stated before these terms encompass the elements or the objects and equivalents thereof listed after these terms, but do not preclude the other elements or objects. The phrases "connect", "connected", etc., are not intended to limit a physical connection or mechanical connection, but may comprise an electrical connection, directly or indirectly.

Figure 1:
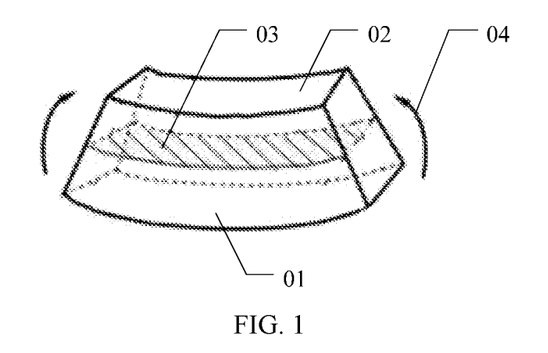
FIG. 1 is a schematic diagram showing force on bending material.

FIG. 1 is a schematic diagram showing force on bending material. As shown in FIG. 1, during bending the material, an outer layer 01 is stretched and an inner layer 02 is pressed; on a cross-section of the material, a transition layer 03 that is neither tensioned nor pressed must exist, that is, a stress on the transition layer is almost equal to zero; this transition layer 03 is called a neutral layer 03 of the material. A length of the neutral layer 03 keeps unchanged during bending the material, so that it will not be damaged by tension or pressure. It should be noted that, the above-mentioned "outer layer" and "inner layer" are sequentially arranged in a bending direction 04 of the material.

The inventor(s) of the present application has noticed that the foldable display screen bent inward cannot display after being bent, so that a display device (such as a mobile phone) adopting the foldable display screen is required to be provided with an additional display screen to implement displaying in the bending state, which leads to an increased cost, an increased thickness and a reduced battery life; on the other hand, the foldable display screen bent outward can still display after being bent, and can also achieve a high screen ratio. However, a display side of the foldable display screen bent outward is exposed to the outside and is easily damaged by external hard objects. Therefore, the inventor(s) of the present application conceives providing two cover protection layers (Cover) on the display side of the foldable display screen to improve mechanical properties of the foldable display screen, such as pencil hardness, impact resistance, and scratch resistance, etc. However, the additional protection cover layer on the cover protection layer will affect the position of the neutral layer, which is likely to cause an important film layer of the foldable display screen to break during folding.

In this regard, the embodiments of the present disclosure provide a foldable display screen and a display device. The foldable display screen comprises a display panel, a first optical adhesive layer, a first cover protection layer, a second optical adhesive layer and a second cover protection layer; the first optical adhesive layer is located on the display panel; the first cover protection layer is located on a side of the first optical adhesive layer away from the display panel; the second optical adhesive layer is located on a side of the first cover protection layer away from the first optical adhesive layer; the second cover protection layer is located on a side of the second optical adhesive layer away from the first cover protection layer; at an operating temperature, an elastic modulus of the second optical adhesive layer is smaller than an elastic modulus of the first optical adhesive layer. Thus, on the one hand, the foldable display screen can improve the mechanical properties of the foldable display screen such as the pencil hardness, the impact resistance, and the scratch resistance by providing two cover protection layers; on the other hand, in the foldable display screen, by making the elastic modulus of the second optical adhesive layer to be smaller than the elastic modulus of the first optical adhesive layer, the second optical adhesive layer can reduce the influence of the second cover protection layer on the film layers located on the side of the second optical adhesive layer away from the second cover protection layer when the foldable display screen is bent, so that the position of the neutral layer of the foldable display screen changes little, or even does not change, and thus the foldable display screen can prevent the important film layers of the foldable display screen from breaking while improving the mechanical properties of the foldable display screen, such as the pencil hardness, the impact resistance and the scratch resistance, and etc.

The foldable display screen according the embodiments of the present disclosure, the manufacturing method thereof and the display device are described in detail below with reference to the drawings.

Figure 2:
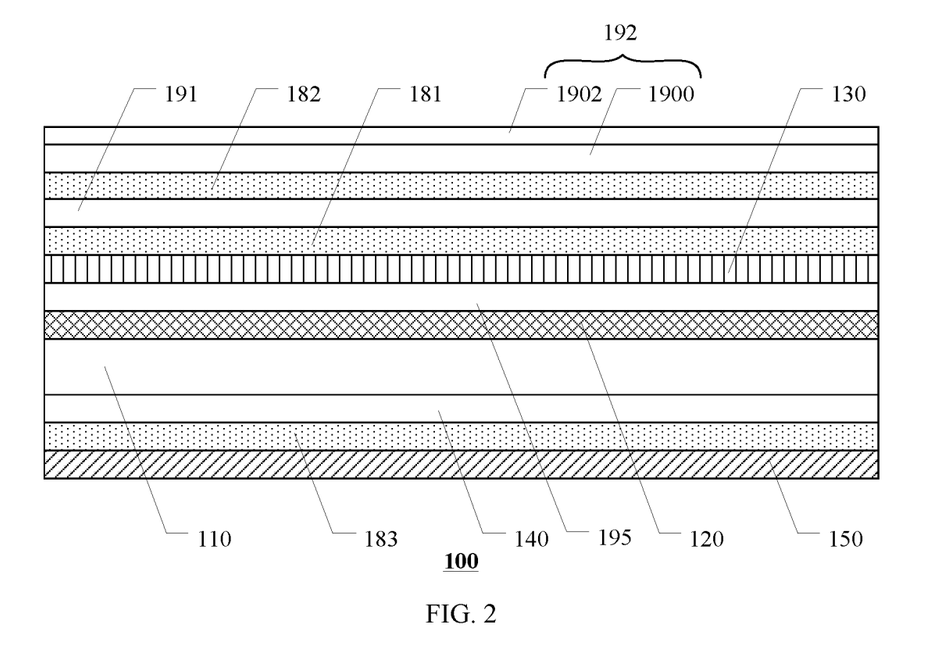
FIG. 2 is a schematic structural diagram of a foldable display screen according to an embodiment of the present disclosure.

An embodiment of the present disclosure provides a foldable display screen. FIG. 2 is a schematic structural diagram of a foldable display screen according to an embodiment of the present disclosure. As shown in FIG. 2, the foldable display screen 100 comprises a display panel 110, a first optical adhesive layer 181, a first cover protection layer 191, a second optical adhesive layer 182, and a second cover protection layer 192 disposed in this order. The first optical adhesive layer 181 is located on the display panel 110; the first cover protection layer 191 is located on a side of the first optical adhesive layer 181 away from the display panel 110, for example, the first cover protection layer 191 is adhered to the display panel 110 by the first optical adhesive layer 181. The second optical adhesive layer 182 is located on a side of the first cover protection layer 191 away from the first optical adhesive layer 181; the second cover protection layer 192 is located on a side of the second cover protection layer 182 away from the first cover protection layer 191, for example, the second cover protection layer 192 is adhered to the first cover protection layer 191 by the second optical adhesive layer 182. In the foldable display screen 100 according to this embodiment, at an operating temperature, for example, a temperature ranges from 0 to 60 degrees Celsius, the elastic modulus of the second optical adhesive layer 182 is smaller than the elastic modulus of the first optical adhesive layer 181. It should be noted that the above-mentioned foldable display screen can be either a foldable display screen bent outward or the foldable display screen bent inward, and the embodiments of the present disclosure are not limited herein.

In the foldable display screen according to this embodiment, because the first cover protection layer and the second cover protection layer are provided, the mechanical properties of the foldable display screen such as the pencil hardness, the impact resistance, the scratch resistance, and etc. can be improved to some extent. On the other hand, in the foldable display screen, the elastic modulus of the second optical adhesive layer is made to be smaller than the elastic modulus of the first optical adhesive layer (in this case, a rigidity of the second optical adhesive layer is smaller than that of the first optical adhesive layer), so that when the foldable display screen is bent, the second optical adhesive layer can reduce the influence of the second cover protection layer on the film layers located on the side of the second optical cover layer away from the second cover protection layer (i.e. the film layers, such as the first cover protection layer, the first optical adhesive layer and the display panel, etc.), so that the position of the neutral layer of the foldable display screen changes little or even does not change. Thus, the foldable display screen can prevent the important film layer of the foldable display screen (for example, the film layer where the thin film transistor is located) from breaking while improving the mechanical properties of the foldable display screen such as the pencil hardness, the impact resistance, the scratch resistance, and etc. That is, the foldable display screen has better bending performance in addition to higher mechanical properties such as the pencil hardness, the impact resistance and the scratch resistance.

For example, the first optical adhesive layer 181 and the second optical adhesive layer 182 are selected as different materials or undergo different processing, to achieve that, at the operating temperature, for example the temperature ranging from 0 to 60 degrees Celsius, the elastic modulus of the second optical adhesive layer 182 is smaller than the elastic modulus of the first optical adhesive layer 181.

In some examples, at the temperature ranging from 0 to 60 degrees Celsius, a ratio of the elastic modulus of the second optical adhesive layer 182 to the elastic modulus of the first optical adhesive layer 181 ranges from 1/3 to 4/5. In this case, the second optical adhesive layer 182 can effectively reduce the influence of the second cover protection layer 192 on the film layers on the side of the second optical adhesive layer 182 away from the second cover protection layer 192, so that the position of the neutral layer of the foldable display screen 100 changes little, or even does not change.

For example, the elastic modulus of the first optical adhesive layer 181 at the temperature of 20 degrees Celsius can range from 20 to 40 Kpa, and the elastic modulus of the first optical adhesive layer 181 at the temperature of 60 degrees Celsius can be 5 to 25 Kpa. In this case, the elastic modulus of the second optical adhesive layer 182 at the temperature of 20 degrees Celsius can be 40 to 60 Kpa, and the elastic modulus of the second optical adhesive layer 182 at the temperature of 60 degrees Celsius can be 20 to 40 Kpa.

In some examples, as shown in FIG. 2, orthographic projections of the first cover protection layer 191, the second cover protection layer 192, the first optical adhesive layer 181, and the second optical adhesive layer 182 on a plane where a main surface of the display panel 110 is located completely coincide. Of course, the embodiments of the present disclosure comprise but are not limited to this, and the orthographic projection of the second cover protection layer 192 on the plane where the main surface of the display panel 110 is located can be greater than the orthographic projections of the first optical adhesive layer 181 and the second optical adhesive layer 182 on the plane where the main surface of 110 of the display panel is located. In some examples, as shown in FIG. 2, the first cover protection layer 191 can comprise a flexible polymer layer 1900.

In some examples, as shown in FIG. 2, the second cover protection layer 192 can comprise a flexible polymer layer 1900 and a harden layer 1902.

For example, the flexible polymer layer 1900 can be selected from one or more of the group consisting of polyimide, polyethylene naphthalate, polyethylene terephthalate, and ultra-thin glass. The harden layer 1902 can be selected from acrylic or siloxane polymers.

It is should be noted that, in some examples, because the first cover protection layer 191 is located on a side of the second cover protection layer 192 close to the display panel 110, the first cover protection layer 191 is not required to be provided with any harden layer.

For example, as shown in FIG. 2, the orthographic projection of the flexible polymer layer 1900 on the plane where the main surface of the display panel 110 is located and the orthographic projection of the harden layer 1902 on the plane where the main surface of the display panel 110 is located can completely coincide. Of course, the present disclosure comprises but is not limited to this. The orthographic projection of the harden layer 1902 on the plane where the main surface of the display panel 110 is located can also be smaller than the orthographic projection of the flexible polymer layer 1900 on the plane where the main surface of the display panel 110 is located, i.e. it falls within the orthographic projection of the flexible polymer layer 1900 on the plane where the main surface of the display panel 110 is located. For example, the foldable display screen can comprise a bending region and a non-bending region, the flexible polymer layer can cover both the bending region and the non-bending region, and the harden layer can cover only the non-bending region and does not cover the bending region. For example, all the materials of the first optical adhesive layer 181 and the second optical adhesive layer 182 can comprise at least one selected from the group consisting of organic silicone, acrylic resin, polyurethane, and epoxy resin.

In some examples, a thickness of the first optical adhesive layer 181 can range from 40 to 60 microns, and a thickness of the second optical adhesive layer 182 can range from 40 to 60 microns.

For example, the thickness of the first optical adhesive layer 181 can be equal to the thickness of the second optical adhesive layer 182.

In some examples, as shown in FIG. 2, the foldable display screen 100 further comprises a touch layer 120 for implementing a touch function. The touch layer 120 is located between the display panel 110 and the first optical adhesive layer 181. In this case, the neutral layer of the foldable display screen 100 can be located in at least one of the display panel 110 and the touch layer 120, thereby effectively preventing the display panel 110 and the touch layer 120 from breaking when the foldable display screen 100 is bent.

For example, the touch layer 120 is in direct contact with the display panel 110, that is, the touch layer 120 is directly disposed on the packaging layer or the opposing substrate of the display panel 110, so that the integration of the touch layer 120 and the display panel 110 can be improved. Of course, the embodiments of the present disclosure comprise but are not limited to this, and the touch layer can also be attached to the display panel by an adhesive layer or an adhesive.

For example, the touch layer can be a mutual-capacitive touch layer or a self-capacitive touch layer. In addition, the touch layer can be made of transparent metal oxide, such as indium tin oxide, or can also be made of metal mesh.

Figure 3:
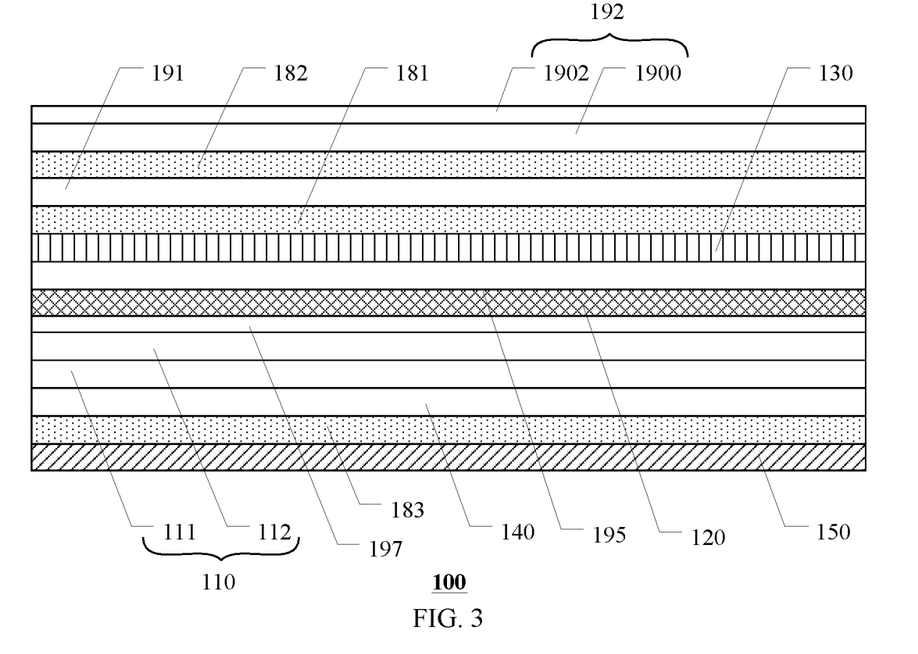
FIG. 3 is a schematic structural diagram of another foldable display screen according to an embodiment of the present disclosure.

FIG. 3 is a schematic structural diagram of another foldable display screen according to an embodiment of the present disclosure. As shown in FIG. 3, the display panel 110 can be an organic light emitting diode display panel; in this case, the display panel 110 comprises a light emitting layer 111 and a packaging layer 112 covering the light emitting layer 111. In this case, the neutral layer of the foldable display screen 100 comprises at least one of the light emitting layer 111, the packaging layer 112 and the touch layer 120 as mentioned above, that is, the neutral layer of the foldable display screen 100 is located in at least one of the light emitting layer 111, the packaging layer 112, and the touch layer 120, thereby effectively preventing the light emitting layer 111, the packaging layer 112, and the touch layer 120 from breaking, etc., when the foldable display screen is bent. Of course, the display panel 110 can also be other display panels that can be bent, and the embodiments of the present disclosure are not limited herein.

For example, the touch layer 120 is located on the side of the packaging layer 112 away from the light emitting layer 111 and directly in contact with the packaging layer 112, that is, the touch layer 120 is located on the surface of the packaging layer 112 away from the light emitting layer 111, so that the integration of the touch layer 120 and the display panel 110 can be improved. Of course, the embodiments of the present disclosure comprise but are not limited to this, and the touch layer can also be attached to the display panel by an adhesive layer or a glue.

In some examples, as shown in FIGS. 2 and 3, the foldable display screen 100 further comprises an anti-reflective layer 130, which is located between the touch layer 120 and the first optical adhesive layer 181 and can have a function of preventing reflection of ambient light, to improve the display quality.

For example, the anti-reflective layer 130 can be a polarizer, for example, a circular polarizer. It should be noted that the above circular polarizer can include a linear polarizer and a 1/4 wave plate.

In some examples, as shown in FIGS. 2 and 3, the foldable display screen can further comprise: a first adhesive layer 195 located between the anti-reflective layer 130 and the touch layer 120 for attaching the anti-reflective layer 130 to the touch layer 120. In some examples, as shown in FIG. 3, the foldable display screen comprises: a second adhesive layer 197 located between the touch layer 120 and the display panel 110.

For example, the first adhesive layer and the second adhesive layer can be made of the pressure sensitive adhesive (PSA). Of course, the embodiments of the present disclosure comprise but are not limited to this, and the first adhesive layer and the second adhesive layer can be made of other adhesive layers.

In some examples, as shown in FIGS. 2 and 3, the foldable display screen 100 further comprises a base film 140 located on the side of the display panel 110 away from the touch layer 120, to protect the side of the display panel 110 away from the touch layer 120.

In some examples, as shown in FIGS. 2 and 3, the foldable display screen 100 further comprises a support plate 150 located on a side of the base film 140 away from the display panel 110. Because the display panel 110 is a flexible display panel, the support plate 150 can support the display panel 110; on the other hand, the support plate 150 can also be beneficial for the foldable display screen 100 to recover to a flat state after being bent.

For example, the support plate 150 can be made of a steel sheet, such as a stainless steel sheet. Because the steel sheet has higher strength and better recovery performance, it can have a function of better supporting the display panel 110, and is also beneficial for the foldable display screen 100 to recover to a flat state after being bent. Of course, the embodiments of the present disclosure comprise but are not limited to this, and the support plate 150 can also be made of other suitable materials.

In some examples, as shown in FIGS. 2 and 3, the foldable display screen 100 further comprises a third optical adhesive layer 183 for adhering the support plate 150 to the side of the base film 140 away from the display panel 110.

For example, in a temperature ranging from 0 to 60 degrees Celsius, the elastic modulus of the third optical adhesive layer 183 and the elastic modulus of the first optical adhesive layer 181 can be substantially equal to each other. It should be noted that the above "substantially equal" comprises the case in which the elastic modulus of the third optical adhesive layer is completely identical to the elastic modulus of the first optical adhesive layer, and also comprises the case in which the difference between the elastic modulus of the third optical adhesive layer and the elastic modulus of the first optical adhesive layer is smaller than 5% of the average of the elastic modulus of the first optical adhesive layer.

Figure 4:
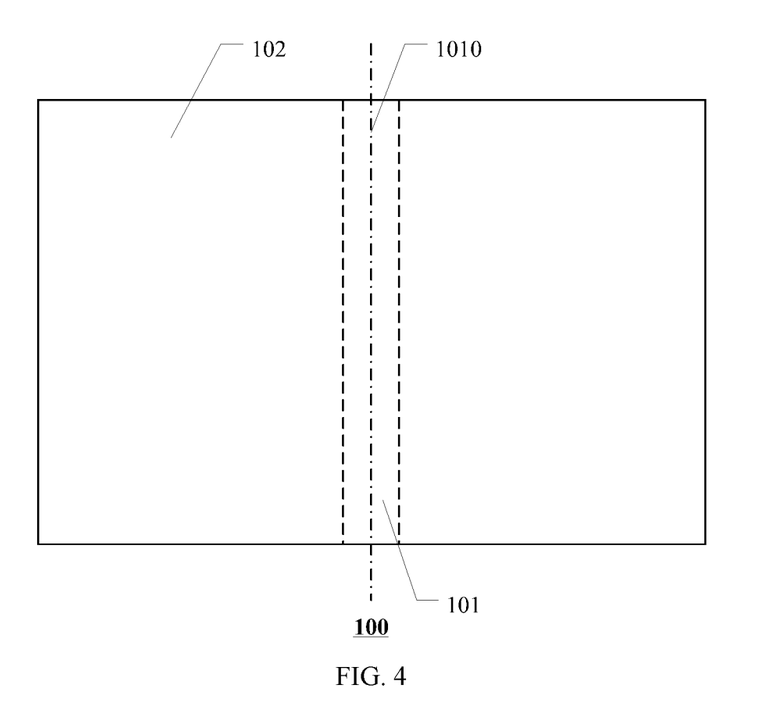
FIG. 4 is a schematic plan view of a foldable display screen according to an embodiment of the present disclosure.

In some examples, as shown in FIGS. 2 and 3, edges of the anti-reflective layer 130, the touch layer 120, the first adhesive layer 195, and the second adhesive layer 197 are level with one another. Because the anti-reflective layer 130, the touch layer 120, the first adhesive layer 195, and the second adhesive layer 197 can be cut in the same cutting process, the edges of the anti-reflective layer 130, the touch layer 120, the first adhesive layer 195, and the second adhesive layer 197 are level with one another. FIG. 4 is a schematic plan view of a foldable display screen according to an embodiment of the present disclosure. As shown in FIG. 4, the foldable display screen 100 comprises a bending region 101 and a non-bending region 102; the bending region 101 is configured to be bent along a rotation axis 1010 extending in a first direction, and the non-bending region 102 is located on at least one side of the bending region 101 in a second direction, and the second direction is perpendicular to the first direction. That is, the bending region 101 of the foldable display screen 100 can be bent, and the non-bending region 102 of the foldable display screen 100 may not be bent, thereby improving the flatness of the foldable display screen.

For example, as shown in FIG. 4, the non-bending region 102 is located on both sides of the bending region 101 in the second direction.

In some examples, as shown in FIG. 4, a size of the bending region 101 in the first direction is equal to a size of the non-bending region 102 in the first direction.

In some examples, when the foldable display screen comprises the non-bending region and the bending region, the support plate can be provided with a plurality of openings in the bending region, to reduce the stress during being bent. Of course, the embodiments of the present disclosure comprise but are not limited to this, and the support plate can also be a complete plate-like structure.

In some examples, the foldable display screen according to the embodiments of the present disclosure can achieve the bending performance of a radius R5 (mm) of bending outward and a radius R3 (mm) of bending inward.

In some examples, as shown in FIG. 4, when the foldable display screen 100 according to an embodiment of the present disclosure is bent outward, i.e., in an bent outward state, any one of two non-bending regions 102 and a part of the bending region 101 close to the one of the two non-bending regions 101 can be used as an independent sub-display screen to display a picture. In this case, the foldable display screen 100 can display a picture on one side or two pictures on both sides at the same time. When the foldable display screen 100 according to the embodiment of the present disclosure is in the expanded state, the two non-bending regions 102 and the non-bending region 101 between the two bending regions 102 can display a same picture together or display different pictures in split screens mode. Embodiments of the present disclosure comprise but are not limited to this.

For example, one of the above-mentioned two pictures can be used as a main picture, and the other of the above-mentioned two pictures can be used as a virtual keyboard, to improve the user's manipulation experience.

For example, one of the above-mentioned two pictures can be a picture output by one program, and the other of the above-mentioned two pictures can be a picture output by another program, to achieve a multi-functional process.

Figure 5:
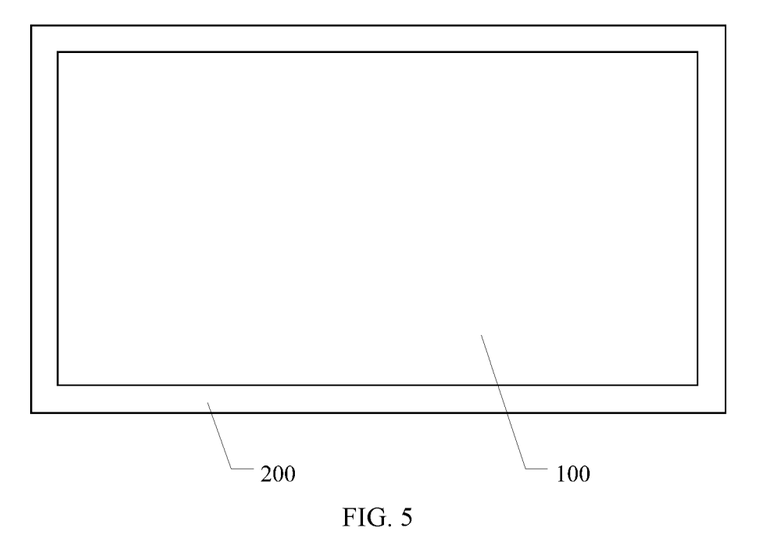
FIG. 5 is a schematic diagram of a display device according to an embodiment of the present disclosure.

An embodiment of the present disclosure also provides a display device. FIG. 5 is a schematic diagram of a display device according to an embodiment of the present disclosure. As shown in FIG. 5, the display device 200 comprises the foldable display screen 100 according to any of the above examples. Therefore, the display device also has the beneficial technical effect of the foldable display screen, that is, the display device has better bending performance in addition to higher mechanical properties such as the pencil hardness, the impact resistance and the scratch resistance.

In some examples, the display device 200 can be a mobile phone. Of course, the embodiments of the present disclosure comprise but are not limited to this, and the display device 200 can also be an electronic device with a display function such as a tablet, a laptop, a television, an electronic photo frame, and the like.

An embodiment of the present disclosure further provides a method of manufacturing the foldable display screen. The method comprises: forming a display panel; forming a base film on a side of the display panel; forming a touch layer and an anti-reflective layer on a side of the display panel away from the base film, for example, by attaching the anti-reflective layer to the display panel by an adhesive layer or a glue; forming a cover protection layer, the cover protection layer comprising a first cover protection layer, a first optical adhesive layer, a second cover protection layer and a second optical adhesive layer; and attaching a side of the protection layer where the first optical adhesive layer is located to a side of the anti-reflective layer away from the touch layer.

The following statements should be noted:
(1) The accompanying drawings involve only the structure(s) in connection with the embodiment(s) of the present disclosure, and other structure(s) can be referred to common design(s).
(2) In case of no conflict, features in one embodiment or in different embodiments can be combined.

What are described above is the embodiments of the disclosure only and not limitative to the scope of the disclosure; any of those skilled in related arts can easily conceive variations and substitutions in the technical scopes disclosed by the disclosure, which should be encompassed in protection scopes of the disclosure. Therefore, the scopes of the disclosure should be defined in the appended claims.

What is claimed is:

1. A foldable display screen, comprising:
a display panel;
a first optical adhesive layer on the display panel;
a first cover protection layer on a side of the first optical adhesive layer away from the display panel;
a second optical adhesive layer on a side of the first cover protection layer away from the first optical adhesive layer; and
a second cover protection layer on a side of the second optical adhesive layer away from the first cover protection layer,
wherein, at an operating temperature, an elastic modulus of the second optical adhesive layer is smaller than an elastic modulus of the first optical adhesive layer,
the elastic modulus of the second optical adhesive layer at the temperature of 20 degrees Celsius ranges from 20 to 40 Kpa, and the elastic modulus of the second optical adhesive layer at the temperature of 60 degrees Celsius ranges from 5 to 25 Kpa,
wherein the elastic modulus of the first optical adhesive layer at the temperature of 20 degrees Celsius ranges from 40 to 60 Kpa, and the elastic modulus of the first optical adhesive layer at the temperature of 60 degrees Celsius ranges from 20 to 40 Kpa,
the foldable display screen further comprises:
a touch layer between the display panel and the first optical adhesive layer,
wherein a neutral layer of the foldable display screen comprises at least one of the display panel and the touch layer.

2. The foldable display screen according to claim 1, wherein the operating temperature ranges from 0 to 60 degrees Celsius.

3. The foldable display screen according to claim 2, wherein, in the range of the operating temperature 0 to 60 degrees Celsius, a ratio of the elastic modulus of the second optical adhesive layer and the elastic modulus of the first optical adhesive layer ranges from 1/3 to 4/5.

4. The foldable display screen according to claim 1, wherein the display panel comprises an organic light emitting diode display panel, the organic light emitting diode display panel comprises a light emitting layer and a packaging layer covering the light emitting layer, the touch layer is located on a side of the packaging layer away from the light emitting layer and is in direct contact with the packaging layer, the neutral layer comprises at least one of the light emitting layer, the packaging layer, and the touch layer.

5. The foldable display screen according to claim 1, further comprising:
an anti-reflective layer between the touch layer and the first optical adhesive layer;
a base film on a side of the display panel away from the touch layer; and
a support plate on a side of the base film away from the display panel.

6. The foldable display screen according to claim 5, wherein the anti-reflective layer comprises a polarizer.

7. The foldable display screen according to claim 5, further comprising:
a first adhesive layer between the anti-reflective layer and the touch layer;
a second adhesive layer between the touch layer and the display panel; and
a third optical adhesive layer between the base film and the support plate.

8. The foldable display screen according to claim 7, wherein edges of the anti-reflective layer, the first adhesive layer, the second adhesive layer, and the touch layer are level with one another.

9. The foldable display screen according to claim 1, wherein the first cover protection layer comprises a flexible polymer layer.

10. The foldable display screen according to claim 1, wherein the second cover protection layer comprises a flexible polymer layer and a harden layer.

11. The foldable display screen according to claim 1, wherein orthographic projections of the first cover protection layer, the second cover protection layer, the first optical adhesive layer and the second optical adhesive layer on a plane parallel to a main surface of the display panel completely coincide.

12. The foldable display screen according to claim 1, wherein a thickness of the first optical adhesive layer ranges from 40 to 60 microns, and a thickness of the second optical adhesive layer ranges from 40 to 60 microns.

13. The foldable display screen according to claim 1, comprising:
a bending region; and
a non-bending region,
wherein the bending region is configured to be bent along a rotation axis extending in a first direction, the non-bending region is located on at least one side of the bending region in a second direction, and the first direction is perpendicular to the second direction.

14. The foldable display screen according to claim 13, wherein a size of the bending region in the first direction is equal to a size of the non-bending region in the first direction.

15. A display device comprising the foldable display screen according to claim 1.

16. A method of manufacturing the foldable display screen according to claim 1, comprising:
forming the display panel;
forming a base film on a side of the display panel;
forming a touch layer and an anti-reflective layer on a side of the display panel away from the base film;
forming a cover protection layer, the cover protection layer comprising the first cover protection layer, the first optical adhesive layer, the second cover protection layer, and the second optical adhesive layer; and
attaching a side of the protection optical layer where the first optical adhesive layer is located to a side of the anti-reflective layer away from the touch layer.

* * * * *

UNITED STATES PATENT AND TRADEMARK OFFICE
CERTIFICATE OF CORRECTION

| | |
|---|---|
| PATENT NO. | : 11,950,445 B2 |
| APPLICATION NO. | : 16/957768 |
| DATED | : April 2, 2024 |
| INVENTOR(S) | : Zhao Li et al. |

It is certified that error appears in the above-identified patent and that said Letters Patent is hereby corrected as shown below:

On the Title Page

Item (71), "BOE TECHNOLOGYGROUPCO., LTD, Beijing (CN)" should read
--BOE TECHNOLOGYGROUPCO., LTD., Beijing (CN)--

Signed and Sealed this
First Day of October, 2024

Katherine Kelly Vidal
*Director of the United States Patent and Trademark Office*